(12) United States Patent
Hanari

(10) Patent No.: US 8,357,961 B2
(45) Date of Patent: Jan. 22, 2013

(54) ORGANIC EL DEVICE

(75) Inventor: Jun Hanari, Kanazawa (JP)

(73) Assignee: Japan Display Central Inc., Fukaya-shi (JP)

( * ) Notice: Subject to any disclaimer, the term of this patent is extended or adjusted under 35 U.S.C. 154(b) by 472 days.

(21) Appl. No.: 12/569,268

(22) Filed: Sep. 29, 2009

(65) Prior Publication Data

US 2010/0084642 A1    Apr. 8, 2010

(30) Foreign Application Priority Data

Oct. 3, 2008    (JP) .................................. 2008-258577

(51) Int. Cl.
*H01L 31/062* (2012.01)
*H01L 29/08* (2006.01)

(52) U.S. Cl. .......... 257/294; 257/290; 257/291; 257/80; 257/E51.022; 257/E31.095

(58) Field of Classification Search .................... 257/40, 257/80, 291, 292, 443, E51.022, E51.368, 257/59, 72, 79, 290, 294, E31.095
See application file for complete search history.

(56) References Cited

U.S. PATENT DOCUMENTS

| | | | | |
|---|---|---|---|---|
| 5,627,364 A * | 5/1997 | Codama et al. | ............ | 250/208.1 |
| 6,040,810 A * | 3/2000 | Nishimura | ....................... | 345/87 |
| 6,692,984 B2 * | 2/2004 | Yonezawa et al. | ............. | 438/96 |
| 6,852,965 B2 * | 2/2005 | Ozawa | ....................... | 250/208.1 |
| 7,221,333 B2 * | 5/2007 | Yuki | ............................. | 345/36 |
| 7,289,088 B2 * | 10/2007 | Matsumoto | ..................... | 345/76 |
| 2001/0052597 A1 * | 12/2001 | Young et al. | ..................... | 257/59 |
| 2005/0200294 A1 * | 9/2005 | Naugler et al. | ............... | 315/149 |
| 2006/0033016 A1 * | 2/2006 | Ogawa et al. | .................. | 250/221 |
| 2007/0093007 A1 * | 4/2007 | Deane | ........................... | 438/154 |
| 2007/0241998 A1 * | 10/2007 | Fish et al. | ........................ | 345/76 |
| 2007/0257254 A1 * | 11/2007 | Yang et al. | ....................... | 257/40 |
| 2008/0055497 A1 * | 3/2008 | Abileah et al. | .................. | 349/12 |
| 2008/0129194 A1 * | 6/2008 | Abe et al. | ........................ | 313/504 |
| 2011/0042707 A1 * | 2/2011 | Lim et al. | ........................ | 257/99 |

FOREIGN PATENT DOCUMENTS

| | | |
|---|---|---|
| JP | 9-43627 A | 2/1997 |
| JP | 11-75115 A | 3/1999 |
| JP | 11-326954 A | 11/1999 |
| JP | 2002-237923 A | 8/2002 |
| JP | 2005-284661 | 10/2005 |
| JP | 2005-339406 | 12/2005 |

(Continued)

OTHER PUBLICATIONS

Japanese Office Action mailed Nov. 2, 2010 in corresponding Japanese Application No. 2008-258577 (with English Translation).

*Primary Examiner* — Colleen Matthews
*Assistant Examiner* — Galina Yushina
(74) *Attorney, Agent, or Firm* — Oblon, Spivak, McClelland, Maier & Neustadt, L.L.P.

(57) ABSTRACT

An organic EL device includes an array substrate including an insulating substrate and an organic EL element which is disposed above the insulating substrate, a sealing substrate which is disposed on that side of the array substrate, which faces the organic EL element, and is attached to the array substrate, a light sensor which is provided in the array substrate and includes a light-sensing part which receives incident light via the sealing substrate, and a light-shield layer which is disposed between the light sensor and the sealing substrate, and includes an opening portion which is formed right above the light-sensing part of the light sensor.

11 Claims, 7 Drawing Sheets

FOREIGN PATENT DOCUMENTS

| | | |
|---|---|---|
| JP | 2006-79589 A | 3/2006 |
| JP | 2006-253236 A | 9/2006 |
| JP | 2006-323199 A | 11/2006 |
| JP | 2007-300064 A | 11/2007 |

* cited by examiner

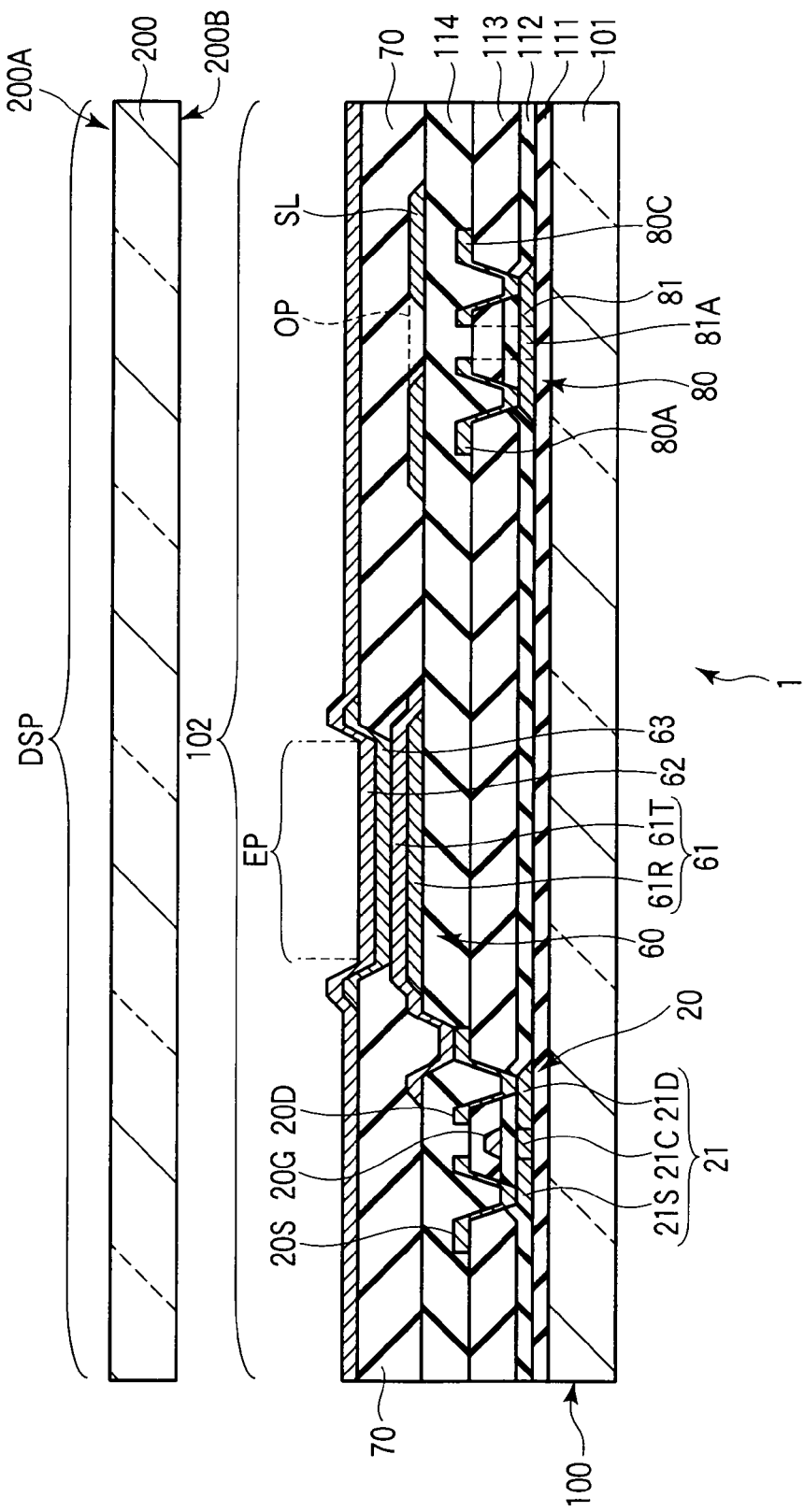
F I G. 2

ORGANIC EL DEVICE

CROSS-REFERENCE TO RELATED APPLICATIONS

This application is based upon and claims the benefit of priority from prior Japanese Patent Application No. 2008-258577, filed Oct. 3, 2008, the entire contents of which are incorporated herein by reference.

BACKGROUND OF THE INVENTION

1. Field of the Invention

The present invention relates to an organic electroluminescence (EL) device.

2. Description of the Related Art

In recent years, display devices using organic electroluminescence (EL) elements have vigorously been developed, by virtue of their features of self-emission, a high response speed, a wide viewing angle, a high contrast, small thickness and light weight.

Patent document 1 (Jpn. Pat. Appln. KOKAI Publication No. 2005-339406), for instance, proposes a touch panel including, apart from a display section, a light-emission element which is composed of an organic EL element, and a light sensor which is provided in association with the light-emission element.

BRIEF SUMMARY OF THE INVENTION

According to an aspect of the present invention, there is provided an organic EL device comprising: an array substrate including an insulating substrate and an organic EL element which is disposed above the insulating substrate; a sealing substrate which is disposed on that side of the array substrate, which faces the organic EL element, and is attached to the array substrate; a light sensor which is provided in the array substrate and includes a light-sensing part which receives incident light via the sealing substrate; and a light-shield layer which is disposed between the light sensor and the sealing substrate, and includes an opening portion which is formed right above the light-sensing part of the light sensor.

According to another aspect of the present invention, there is provided an organic EL device comprising: an insulating substrate; a first insulation film disposed above the insulating substrate; a first semiconductor layer disposed on the first insulation film; a second semiconductor layer which is disposed on the first insulation film and includes a light-sensing part; a second insulation film which covers the first semiconductor layer and the second semiconductor layer and is disposed on the first insulation film; a gate electrode which is disposed on the second insulation film right above the first semiconductor layer; a third insulation film which covers the gate electrode and is disposed on the second insulation film; a source electrode and a drain electrode which are disposed on the third insulation film and are put in contact with the first semiconductor layer; an anode and a cathode which are disposed on the third insulation film, are put in contact with the second semiconductor layer, and expose the light-sensing part; a fourth insulation film which covers the source electrode, the drain electrode, the anode and the cathode, and is disposed on the third insulation film; a first electrode which includes a reflective layer disposed on the fourth insulation film, and is connected to the drain electrode; a light-shield layer which is disposed on the fourth insulation film right above the anode and the cathode, is formed of the same material as the reflective layer, and includes an opening portion which is formed right above the light-sensing part; an organic layer disposed on the first electrode; and a second electrode disposed on the organic layer.

According to still another aspect of the present invention, there is provided an organic EL device comprising: an array substrate including an organic EL element and a pixel circuit which drives the organic EL element, and having an active area which is composed of a plurality of pixels each including a light-emission part of the organic EL element, and a circuit part in which the pixel circuit is disposed; a display surface formed above the active area of the array substrate; a light sensor which is disposed at a position different from a position of the light-emission part in the active area of the array substrate, and includes a light-sensing part which receives incident light from the display surface; and a light-shield layer which is disposed between the light sensor and the display surface and includes an opening portion which is formed right above the light-sensing part of the light sensor.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a cross-sectional view which schematically shows the structure of a display panel including an organic EL element and a light sensor of the organic EL device shown in FIG. 1;

DETAILED DESCRIPTION OF THE INVENTION

Figure 1:
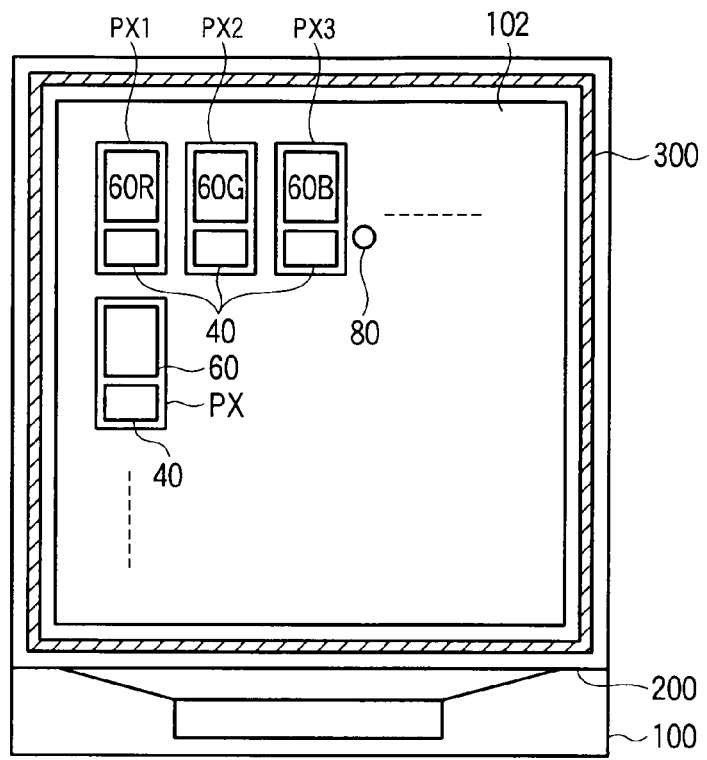
FIG. 1 schematically shows the structure of an organic EL device according to an embodiment of the present invention.

An embodiment of the present invention will now be described in detail with reference to the accompanying drawings. In the drawings, structural elements having the same or similar functions are denoted by like reference numerals, and an overlapping description is omitted.

FIG. 1 is a plan view which schematically shows the structure of an organic EL display device, as an example of an organic EL device, which adopts an active matrix driving method.

Specifically, the organic EL display device includes a substantially rectangular display panel 1. The display panel 1 includes an array substrate 100 and a sealing substrate 200. The array substrate 100 has a substantially rectangular active area 102 which displays an image. The active area 102 is composed of a plurality of pixels PX which are arrayed in a matrix. Each pixel PX includes an organic EL element 60 which is a self-luminous display element, and a pixel circuit 40 for driving the organic EL element 60.

The sealing substrate 200 is arranged at the position opposed to the organic EL element 60 in the active area 102 of the array substrate 100. The sealing substrate 200 is a light-transmissive insulating substrate such as a glass substrate or a plastic substrate.

The array substrate 100 and sealing substrate 200 are attached to each other via a sealant 300 which is formed in a frame shape surrounding the active area 102. The sealant 300 may be a resin material, such as an ultraviolet-curing resin or a thermosetting resin, or may be frit glass such as low-melting-point glass.

FIG. 1 shows, by way of example, the display panel 1 of a color display type. The active area 102 includes a first pixel PX1, a second pixel PX2 and a third pixel PX3 which have different emission light colors. A range of major wavelengths between 595 nm and 800 nm is defined as a first wavelength range, and a color in the first wavelength range is defined as red. A range of major wavelengths, which are longer than 490 nm and shorter than 595 nm, is defined as a second wavelength range, and a color in the second wavelength range is defined as green. A range of major wavelengths between 400 nm and 490 nm is defined as a third wavelength range, and a color in the third wavelength range is defined as blue.

The first pixel PX1 includes a red organic EL element 60R having an emission light color in the first wavelength range and a pixel circuit 40, and corresponds to a red pixel. The second pixel PX2 includes a green organic EL element 60G having an emission light color in the second wavelength range and a pixel circuit 40, and corresponds to a green pixel. The third pixel PX3 includes a blue organic EL element 60B having an emission light color in the third wavelength range and a pixel circuit 40, and corresponds to a blue pixel.

The array substrate 100 further includes a light sensor 80 which is disposed in the active area 102. The light sensor 80 will be described later in greater detail.

FIG. 2 is a cross-sectional view of the display panel 1 including the organic EL element 60 and light sensor 80 of the organic EL display device shown in FIG. 1. The organic EL element 60 shown in FIG. 2 is a top-emission type in which light is emitted from the sealing substrate 200 side.

The array substrate 100 includes a light-transmissive insulating substrate 101, such as a glass substrate or a plastic substrate, and a switching element 20 and an organic EL element 60 which are disposed above the insulating substrate 101. A first insulation film 111 is disposed on the insulating substrate 101. The first insulation film 111 extends over almost the entirety of the active area 102. The first insulation film 111 is formed of, for example, an inorganic compound such as silicon oxide or silicon nitride.

A first semiconductor layer 21 of the switching element 20 is disposed on the first insulation film 111. The first semiconductor layer 21 may be formed of polysilicon, or may be formed of amorphous silicon. In this example, the first semiconductor layer 21 is formed of polysilicon. In the first semiconductor layer 21, a source region 21S and a drain region 21D are formed, with a channel region 21C being interposed therebetween.

The first semiconductor layer 21 is covered with a second insulation film 112. The second insulation film 112 is also disposed on the first insulation film 111. The second insulation film 112 extends over almost the entirety of the active area 102. The second insulation film 112 is formed of, for example, an inorganic compound such as silicon oxide or silicon nitride.

A gate electrode 20G of the switching element 20 is disposed on the second insulation film 112 right above the channel region 21C of the first semiconductor layer 21. In this example, the switching element 20 is a top-gate type p-channel thin-film transistor. The gate electrode 20G is covered with a third insulation film 113. The third insulation film 113 is also disposed on the second insulation film 112. The third insulation film 113 extends over almost the entirety of the active area 102. The third insulation film 113 is formed of, for example, an inorganic compound such as silicon oxide or silicon nitride.

A source electrode 20S and a drain electrode 20D of the switching element 20 are disposed on the third insulation film 113. The source electrode 20S is put in contact with the source region 21S of the semiconductor layer 21. The drain electrode 20D is put in contact with the drain region 21D of the semiconductor layer 21. The gate electrode 20G, source electrode 20S and drain electrode 20D of the switching element 20 are formed of an electrically conductive material such as molybdenum (Mo), tungsten (W), aluminum (Al) or titanium (Ti).

The source electrode 20S and drain electrode 20D are covered with a fourth insulation film 114. The fourth insulation film 114 is also disposed on the third insulation film 113. The fourth insulation film 114 extends over almost the entirety of the active area 102. The fourth insulation film 114 is formed of an organic compound such as such an ultraviolet-curing resin or a thermosetting resin, or an inorganic compound such as silicon nitride.

A first electrode 61, which constitutes an organic EL element 60, is disposed on the fourth insulation film 114. The first electrode 61 is connected to the drain electrode 20D of the switching element 20. In this example, the first electrode 61 corresponds to an anode.

The first electrode 61 has a two-layer structure in which a reflective layer 61R and a transmissive layer 61T are stacked. The reflective layer 61R is disposed on the fourth insulation film 114. The transmissive layer 61T is stacked on the reflective layer 61R. The reflective layer 61R is formed of a light-reflective electrically conductive material, such as silver (Ag) or aluminum (Al). The transmissive layer 61T is formed of a light-transmissive electrically conductive material, such as indium tin oxide (ITO) or indium zinc oxide (IZO). The structure of the first electrode 61 is not limited to the above-described two-layer structure, and may be a multi-layer structure of three layers or more, or a single-layer structure of the reflective layer 61R. In the case of the organic EL element 60 of a top-emission type, the first electrode 61 includes at least the reflective layer 61R. In the case of adopting a micro-cavity structure, the first electrode 61 includes the reflective layer 61R.

A partition wall 70 is disposed on the fourth insulation film 114. The partition wall 70 is disposed along the peripheral edge of the first electrode 61.

The partition wall 70 overlaps a part of the first electrode 61. The partition wall 70 is formed of an insulating material, for instance, an organic compound such as an ultraviolet-curing resin or a thermosetting resin, or an inorganic compound such as silicon nitride. That part of the first electrode 61, which is exposed from the partition wall 70, corresponds to a substantial light-emission part of the organic EL element 60. An organic layer 63, which constitutes the organic EL element 60, is disposed on the first electrode 61. The organic layer 63 includes at least a light-emission layer, and may further include a hole injection layer, a hole transport layer, an electrode injection layer and an electrode transport layer. The material of the organic layer 63 may include a fluorescent material, or may include a phosphorescent material.

A second electrode 62, which constitutes the organic EL element 60, is disposed on the organic layer 63. The second electrode 62 covers not only the organic layer 63 but also the partition wall 70. In this example, the second electrode 62 corresponds to a cathode. The second electrode 62 extends over the entirety of the active area 102. The second electrode 62 is composed of a semi-transmissive layer formed of, e.g. magnesium (Mg)-silver (Ag). The second electrode 62 may include a transmissive layer which is formed of a light-transmissive electrically conductive material such as ITO or IZO. In the case of adopting the micro-cavity structure, the second electrode 62 includes a semi-transmissive layer formed of, e.g. magnesium-silver.

The sealing substrate 200 is disposed above the organic EL element 60, that is, on that side of the array substrate 100, which faces the organic EL element 60. A display surface DSP, which displays an image that is formed by light emitted from the organic EL element 60, is formed on an outer surface 200A of the sealing substrate 200, that is, on that surface of the sealing substrate 200, which is opposed to an inner surface 200B facing the organic EL element 60. The display surface DSP is formed above the active area 102 of the array substrate 100. An optical element, such as a polarizer plate, may be disposed, where necessary, on the outer surface 200A of the sealing substrate 200.

The light sensor 80 is disposed on the same substrate as the organic EL element 60. In this embodiment, as shown in FIG. 2, the light sensor 80 is composed as a photodiode. However, needless to say, the light sensor 80 may have other structure.

Specifically, in the example shown in FIG. 2, a second semiconductor layer 81 of the light sensor 80 is disposed on the first insulation film 111. The second semiconductor layer 81 is disposed in the same layer as the first semiconductor layer 21 of the above-described switching element 20, and the second semiconductor layer 81 can be formed of the same material as the first semiconductor layer 21. Specifically, the second semiconductor layer 81 may be formed of polysilicon, or may be formed of amorphous silicon. In this example, the second semiconductor layer 81 is formed of polysilicon. A part of the second semiconductor layer 81 functions as a light-sensing part 81A which receives incident light which comes in through the sealing substrate 200. The second semiconductor layer 81, like the first semiconductor layer 21, is covered with the second insulation film 112. The third insulation film 113 is stacked on the second insulation film 112 on the second semiconductor layer 81.

An anode 80A and a cathode 80C of the light sensor 80 are disposed on the third insulation film 113. The anode 80A and cathode 80C are put in contact with the second semiconductor layer 81. The anode 80A and cathode 80C expose the light-sensing part 81A of the second semiconductor layer 81. In other words, that part of the second semiconductor layer 81, which does not overlap the anode 80A and cathode 80C, when viewed from the sealing substrate 200 side, forms the light-sensing part 81A.

The anode 80A and cathode 80C are disposed in the same layer as the source electrode 20S and drain electrode 20D of the switching element 20, and may be formed of the same electrically conductive material as the source electrode 20S and drain electrode 20D. Like the source electrode 20S and drain electrode 20D, the anode 80A and cathode 80C are covered with the fourth insulation film 114.

A light-shield layer SL is disposed on the fourth insulation film 114. The light-shield layer SL is disposed right above the anode 80A and cathode 80C. Specifically, the light-shield layer SL is disposed between the light sensor 80 and the sealing substrate 200. An opening portion OP is formed in the light-shield layer SL right above the light-sensing part 81A. The light-shield layer SL is disposed in the same layer as the reflective layer 61R of the first electrode 61 which constitutes the organic EL element 60. The light-shield layer SL is formed of the same electrically conductive material as the reflective layer 61R, for instance, silver (Ag) or aluminum (Al). The light-shield layer SL is covered with the partition wall 70. The second electrode 62 is disposed on the partition wall 70 right above the light sensor 80.

In the light sensor 80, the respective parts disposed between the second semiconductor layer 81 and the display surface DSP, namely the second insulation film 112, third insulation film 113, fourth insulation film 114, partition wall 70, second electrode 62 and sealing substrate 200, are formed of the light-transmissive material. With this structure, the light sensor 80 detects ambient light which is incident on the array substrate 100 via the sealing substrate 200, or reflective light from the sealing substrate 200.

On the other hand, in order to improve the detection capability of the light sensor 80, it is necessary to reduce the influence of light that is emitted from the organic EL element 60 which neighbors the light sensor 80.

For this purpose, in the present embodiment, the light incident on the light-sensing part 81A is restricted by the light-shield layer SL which is disposed between the light sensor 80 and the display surface DSP or between the light sensor 80 and the sealing substrate 200, and by the opening portion OP which is formed in the light-shield layer SL so as to be opposed to the light sensor 80.

Specifically, according to this structure, by the light-shield layer SL that is provided above the light sensor 80 (i.e. on the light incidence side of the light sensor 80), it is possible to reduce the influence of light which is directly incident on the light sensor 80 from the neighboring organic EL element 60, and to reduce the influence of reflective light which is reflected by the interface of the thin film constituting the array substrate 100. In addition, ambient light which is incident via the sealing substrate 200 from the opening portion OP provided in the light-shield layer SL, or the reflective light which is emitted from the organic EL element 60 and is reflected by the display surface DSP, can be made incident on the light-sensing part 81A of the light sensor 80. Thereby, the detection capability of the light sensor 80 can be improved.

In addition, the light sensor 80 can be formed in the same process as the switching element 20 which constitutes the pixel circuit 40. In other words, the second semiconductor layer 81 of the light sensor 80 can be formed in the same process as the first semiconductor layer 21 of the switching element 20, and the anode 80A and cathode 80C of the light sensor 80 can be formed in the same process as the source electrode 20S and drain electrode 20D of the switching element 20. Thus, an additional process for forming the light sensor 80 is needless, and an increase in manufacturing cost can be suppressed.

In the structure in which the top-emission type organic EL element 60, as shown in FIG. 2, is applied to the array substrate 100, the light-shield layer SL can be formed of the same material in the same layer as the reflective layer 61R which constitutes the first electrode 61. Therefore, an additional process for forming the light-shield layer SL is needless and an increase in manufacturing cost can be suppressed.

In the meantime, the structure of the display panel 1 is not limited to the example shown in FIG. 2.

Figure 3:
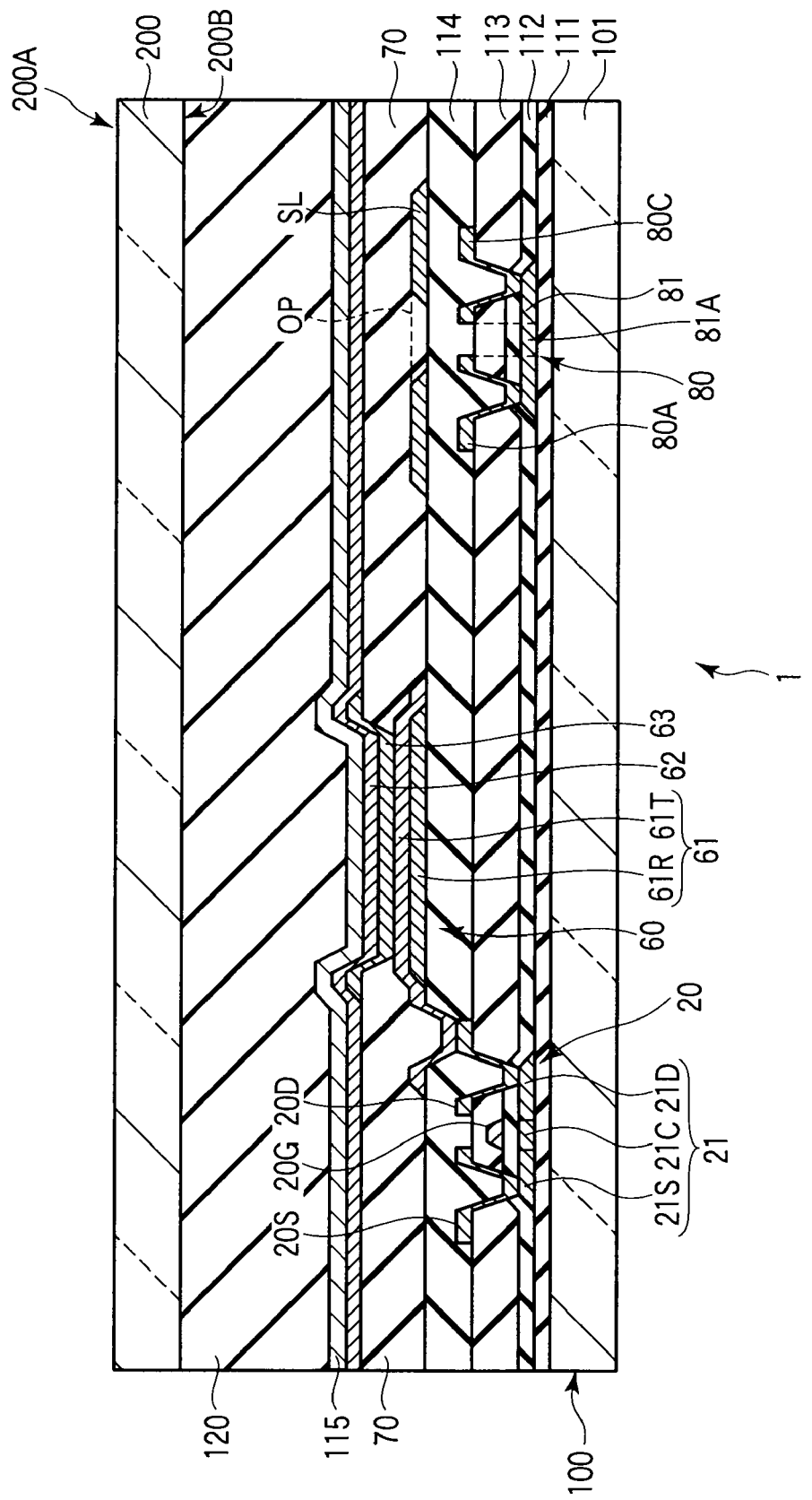
FIG. 3 is a cross-sectional view which schematically shows the structure of another display panel including an organic EL element and a light sensor.

FIG. 3 is a cross-sectional view of another display panel 1 including the organic EL element 60 and light sensor 80. The structural parts common to those in the example of FIG. 2 are denoted by like reference numerals, and a detailed description thereof is omitted. The example shown in FIG. 3 differs from the example shown in FIG. 2 in that the array substrate 100 further includes a protection film 115 which covers the second electrode 62, and a resin layer 120 which is disposed between the protection film 115 and the sealing substrate 200.

The protection film 115 extends over the entirety of the active area 102. Specifically, the protection film 115 covers the organic EL element 60, and also extends immediately over the partition wall 70 which is disposed around the organic EL element 60. The protection film 115 is formed of a material which has light transmissivity and is hardly permeable to moisture, for instance, an inorganic compound such as silicon nitride or silicon oxynitride. In short, the protection film 115 functions as a moisture barrier film which prevents permeation of moisture to the organic EL element 60.

In this case, the sealing substrate 200 is disposed above the protection film 115. The resin layer 120 is stacked on the protection film 115 of the array substrate 100. The resin layer 120 is in contact with the inner surface 200B of the sealing substrate 200. The resin layer 120 is formed of a light-transmissive resin material, such as an ultraviolet-curing resin or a thermosetting resin.

According to this structure, it is possible to prevent moisture from reaching the organic EL element 60.

Figure 4:
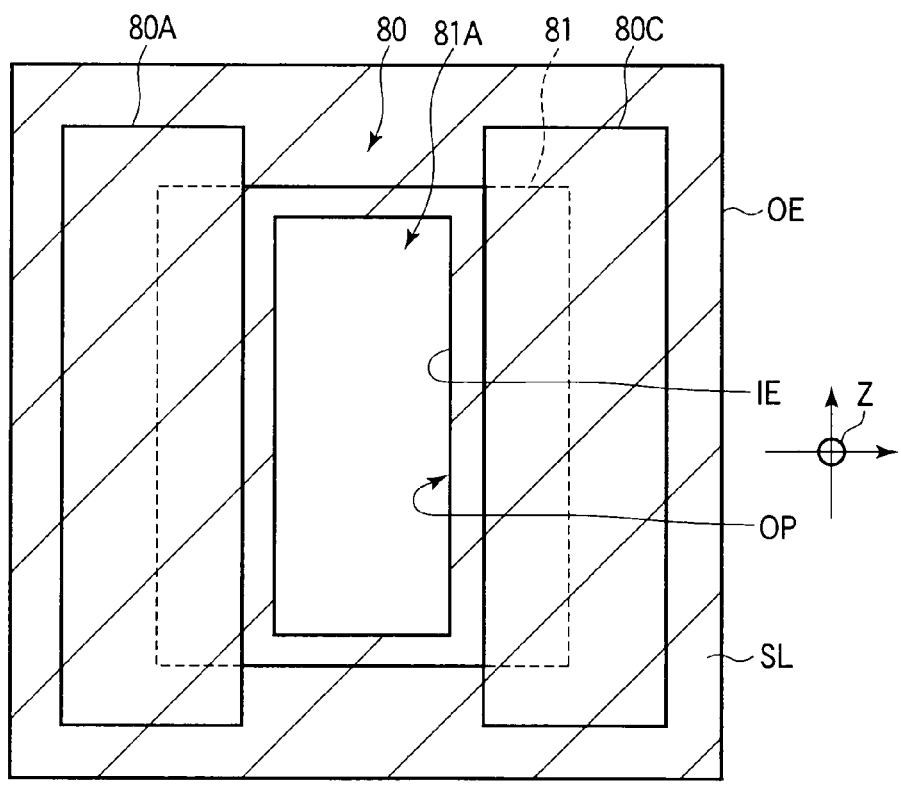
FIG. 4 is a top view of the light sensor and a light-shield layer.

FIG. 4 is a top view of the light sensor 80 and light-shield layer SL.

The anode 80A and cathode 80C of the light sensor 80 are put in contact with the second semiconductor layer 81, and expose the light-sensing part 81A of the second semiconductor layer 81. The opening portion OP in the light-shield layer SL is formed right above the light-sensing part 81A of the second semiconductor layer 81. The opening portion OP is formed to have, for example, a size equal to the size of the light-sensing part 81A or a size smaller than the size of the light-sensing part 81A. In the example shown in FIG. 4, the opening portion OP has a size smaller than the size of the light-sensing part 81A. In this case, an inner edge IE of the light-shield layer SL, which defines the opening portion OP, is positioned right above the light-sensing part 81A. Accordingly, the entire opening portion OP is opposed to the light-sensing part 81A. A part of the opening portion OP may be opposed a part of the anode 80A or cathode 80C, but in this case, compared to the case shown in FIG. 4, the area of the light-sensing part 81A, which is opposed to the opening portion OP, becomes smaller.

In the case where both the light-sensing part 81A and opening portion OP are rectangular, the size thereof may be set, for example, in a range of about 4-50 µm×4-50 µm. It is effective to adjust the size of the opening portion OP in consideration of the pixel size and the influence of emission light noise from the neighboring organic EL element 60.

On the other hand, it is preferable that the light-shield layer SL be formed right above the anode 80A and cathode 80C and cover the entirety of the anode 80A and cathode 80C. It is more preferable that the light-shield layer SL extend to the outside from the anode 80A and cathode 80C, that is, the outer edge OE of the light-shield layer SL be disposed more on the outside than the position right above the anode 80A and cathode 80C.

According to the above structure, incident light in an oblique direction to a normal Z of the light-sensing part 81A is prevented from reaching the light-sensing part 81A, while incident light in a direction along the normal Z of the light-sensing part 81A (i.e. in a frontal direction) reaches the light-sensing part 81A. Therefore, the detection capability of the light sensor 80 can be improved.

It is thus possible to effectively detect reflective light from an object which is put in contact with the display surface DSP, or a variation of ambient light due to the contact of the object with the display surface DSP, and to make use of the display surface DSP of the organic EL display device as a contact input device.

The above-described light sensor 80 may be disposed at a position different from the position of the light-emission part EP of the organic EL element 60 in the active area 102, that is, at any position not overlapping the light-emission part EP. Examples of layout of the light sensor 80 are described below.

Figure 5:
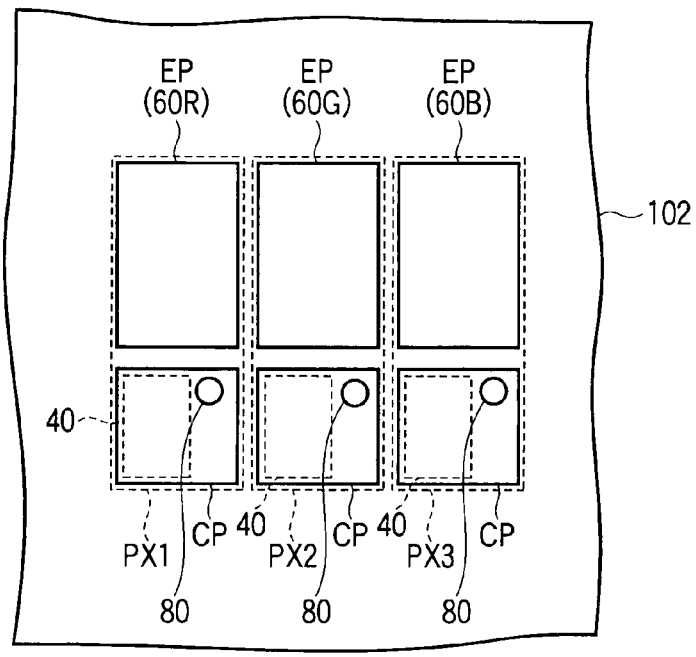
FIG. 5 is a view for explaining an example of arrangement of light sensors in the embodiment.

In an example shown in FIG. 5, the active area 102 includes a first pixel PX1 which includes a light-emission part EP of a red organic EL element 60R and a circuit part CP in which a pixel circuit 40 is disposed; a second pixel PX2 which includes a light-emission part EP of a green organic EL element 60G and a circuit part CP in which a pixel circuit 40 is disposed; and a third pixel PX3 which includes a light-emission part EP of a blue organic EL element 60B and a circuit part CP in which a pixel circuit 40 is disposed. The light sensor 80 is disposed in the circuit part CP of each of the first to third pixels PX1 to PX3.

Figure 6:
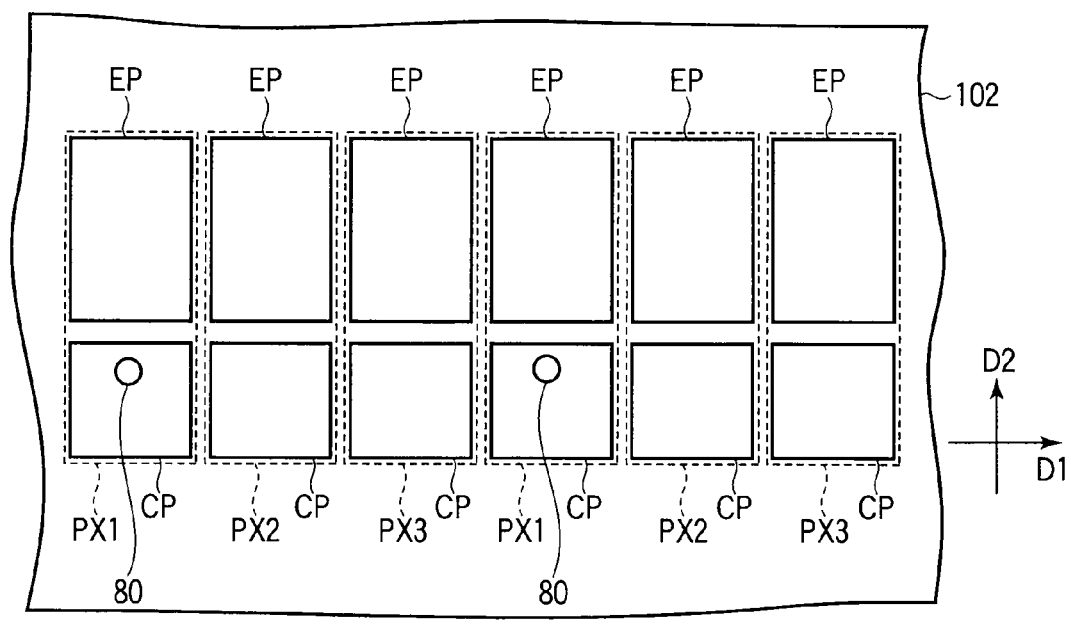
FIG. 6 is a view for explaining another example of arrangement of light sensors in the embodiment.

In an example shown in FIG. 6, in the active area 102, the same first pixel PX1, second pixel PX2 and third pixel PX3 as shown in FIG. 5 are arranged in a first direction D1, and these first pixel PX1, second pixel PX2 and third pixel PX3 are repeatedly arranged in the first direction D1. The light sensor 80 is disposed in the circuit part CP of every n-th pixel (n: a positive integer). In the example shown in FIG. 6, the light sensor 80 is disposed in every third pixel. In other words, the light sensor 80 is disposed in the circuit part CP of the first pixel PX1 alone, and the light sensor 80 is not disposed in the second pixel PX2 or the third pixel PX3. In this case, the light sensor 80 may also be disposed in every n-th pixel in a second direction D2 perpendicular to the first direction D1.

Figure 7:
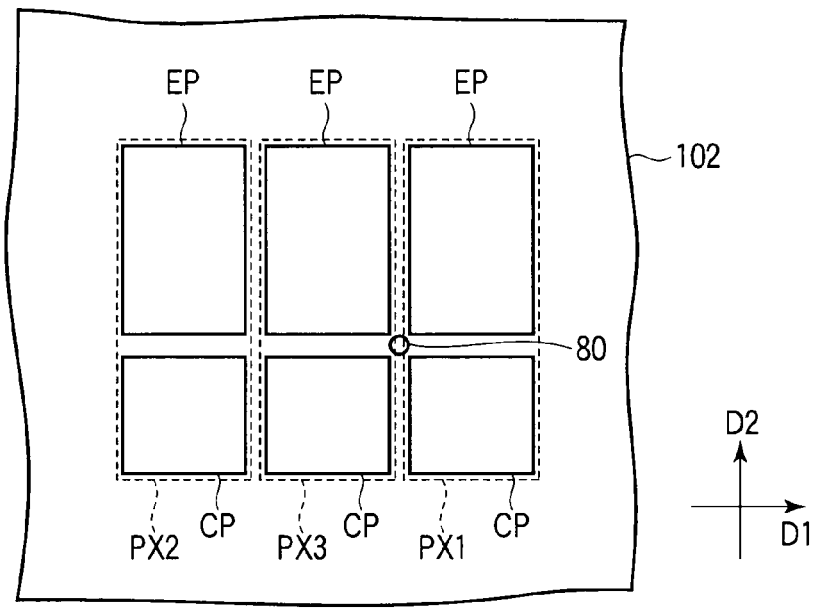
FIG. 7 is a view for explaining still another example of arrangement of light sensors in the embodiment.

In an example shown in FIG. 7, in the active area 102, the same first pixel PX1, second pixel PX2 and third pixel PX3 as shown in FIG. 5 are arranged in the first direction D1. The light sensor 80 is disposed between neighboring two pixels. In the example shown in FIG. 7, the light sensor 80 is disposed between the first pixel PX1 and the third pixel PX3. In other words, the light sensor 80 is disposed in none of the light-emission parts EP and circuit parts CP of the first to third pixels PX1 to PX3. In this example, the light sensor 80 is disposed between the first pixel PX1 and the third pixel PX3, but the light sensor 80 may be disposed between the first pixel PX1 and the second pixel PX2, or between the second pixel PX2 and the third pixel PX3.

In the case of using a light sensor 80 having a highest sensitivity to light in the second wavelength range of green, it is desirable to dispose the light sensor 80 at a position as far as possible from the second pixel PX2. It is thus desirable to dispose the light sensor 80 in the first pixel PX1, in the third pixel PX3, or between the first pixel PX1 and the third pixel PX3. Thereby, the influence of emission light from the organic EL element 60 can further be reduced, and the detection capability of the light sensor 80 can be improved.

Next, a description is given of an example of the pixel circuit and driving circuit of light sensor in the present embodiment. In particular, a description is given of the structure which enables sharing between a control line which is supplied with a control signal necessary for controlling ON/OFF of the light sensor 80 and a control line which is supplied with a control signal necessary for controlling ON/OFF of the organic EL element 60. In the meantime, it is possible to adopt a structure using an exclusive control line for controlling the light sensor 80, or a structure in which the polarities of thin-film transistors for control are varied. The circuit structure is not limited to this example.

Figure 8:
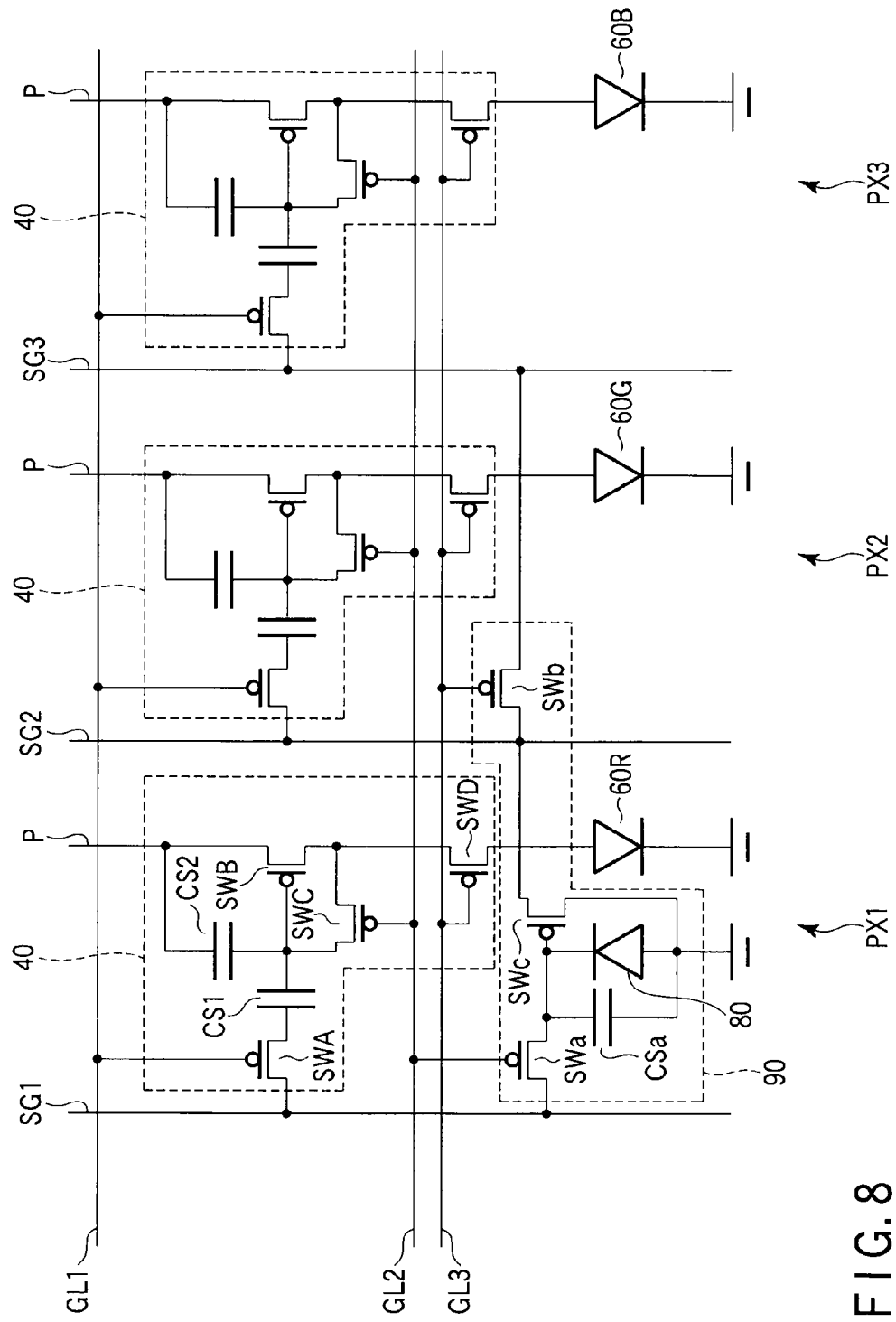
FIG. 8 is a circuit structure diagram for describing a mode of a pixel circuit and a driving circuit of light sensor in the embodiment.

As shown in FIG. 8, the first pixel PX1 includes a pixel circuit 40 for controlling the driving of the red organic EL element 60R. Similarly, the second pixel PX2 includes a pixel circuit 40 for controlling the driving of the green organic EL element 60G, and the third pixel PX3 includes a pixel circuit 40 for controlling the driving of the blue organic EL element 60B. Each of the pixel circuits 40 has the same structure and comprises four switches SWA, SWB, SWC and SWD, and two storage capacitance elements CS1 and CS2. The structure of the pixel circuit 40 of the first pixel PX1 is described in detail. The four switches SWA, SWB, SWC and SWD are composed of thin-film transistors.

The gate electrode of the switch SWA is connected to a first gate line GL1, and the source electrode thereof is connected to a video signal line SG1 (the source electrode of the switch SWA is connected to a video signal line SG2 in the pixel circuit 40 of the second pixel PX2, and the source electrode of the switch SWA is connected to a video signal line SG3 in the pixel circuit 40 of the third pixel PX3).

The gate electrode of the switch SWB is connected to the drain electrode of the switch SWA via the storage capacitance element CS1. The source electrode of the switch SWB is connected to a power supply line P, and the drain electrode thereof is connected to the switch SWD. The gate electrode of the switch SWC is connected to a second gate line GL2. The gate electrode of the switch SWD is connected to a third gate line GL3. The source electrode of the switch SWD is connected to the switch SWB, and the drain electrode thereof is connected to a first electrode of the red organic EL element 60R.

In the example shown in FIG. 8, a driving circuit of light sensor 90 including the light sensor 80 is disposed in the first pixel PX1, and comprises three switches SWa, SWb and SWc and one storage capacitance element CSa. The three switches SWa, SWb and SWc are composed of thin-film transistors.

The gate electrode of the switch SWa is connected to the second gate line GL2. The source electrode and drain electrode of the switch SWa are connected, respectively, to the video signal line SG1 and to the light sensor 80 and the gate electrode of the switch SWc. The gate electrode of the switch SWb is connected to the third gate line GL3. The source electrode and drain electrode of the switch SWb are connected, respectively, to the video signal line SG2 and to the video signal line SG3. The source electrode and drain electrode of the switch SWc are connected, respectively, to the video signal line SG2 and to the anode of the light sensor 80.

In this structure, the third gate line GL3 corresponds to the control line which is supplied with control signals necessary for controlling the ON/OFF of the organic EL element 60 and light sensor 80.

Figure 9:
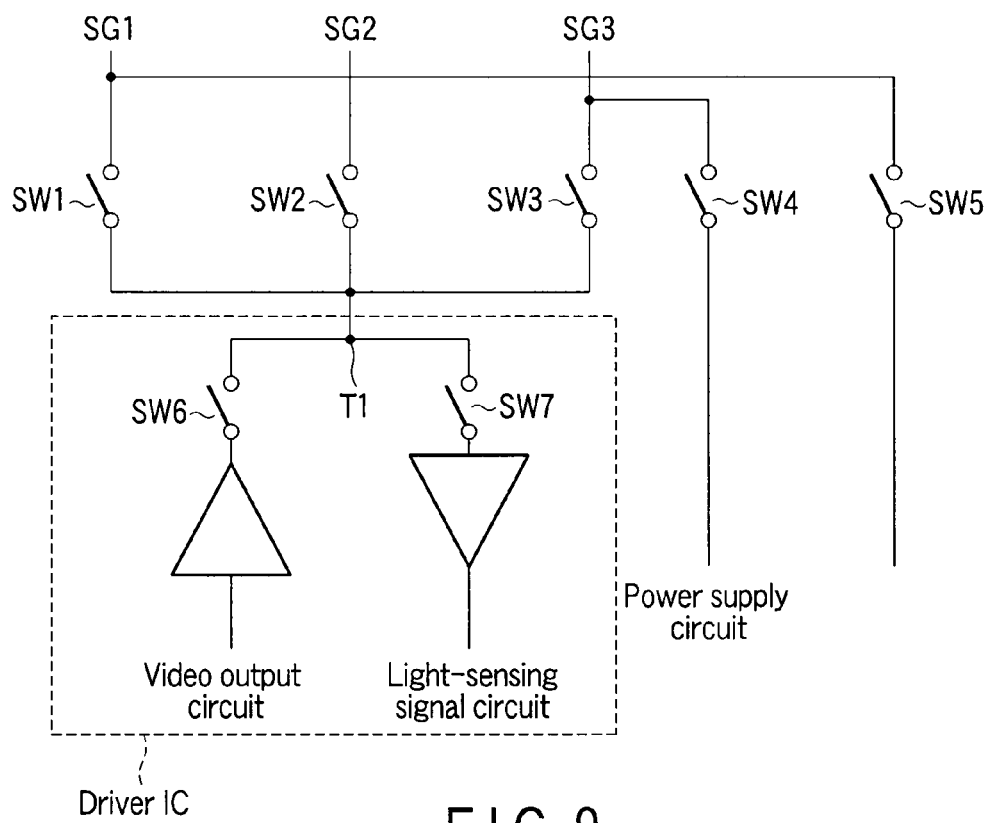
FIG. 9 is a circuit structure diagram for describing a mode of a video signal line driver in the embodiment.

FIG. 9 shows one mode of a video signal driver which is applicable to the present embodiment. FIG. 9 shows the example in which one output of a driver IC for video signal write is time-divided, and the video signal is successively written to the three video signal lines.

A switch SW1 is provided between an output terminal T1 of the driver IC and the video signal line SG1. A switch SW2 is provided between the output terminal T1 of the driver IC and the video signal line SG2. A switch SW3 is provided between the output terminal T1 of the driver IC and the video signal line SG3. A switch SW4 is provided between the video signal line SG3 and a power supply circuit. In the driver IC, a switch SW6 is provided between the output terminal T1 and a video signal output circuit. In addition, in the driver IC, a switch SW7 is provided between the output terminal T1 and a light-sensing signal circuit. The video signal output circuit and the light-sensing signal circuit may be incorporated in the driver IC, or may be connected to input terminals (not shown) of the driver IC.

In the above-described example shown FIG. 9, the three video signal lines SG1 to SG3 are connected to one output terminal T1 of the driver IC. Alternatively, one video signal line may be connected to one output terminal T1. In addition, in the case of the example shown in FIG. 9, the driver IC for video signal write serves also as the driver IC for controlling the driving of the light sensor 80. Alternatively, the driver IC for video signal write and the driver IC for controlling the driving of the light sensor 80 may be separately structured.

Figure 10:
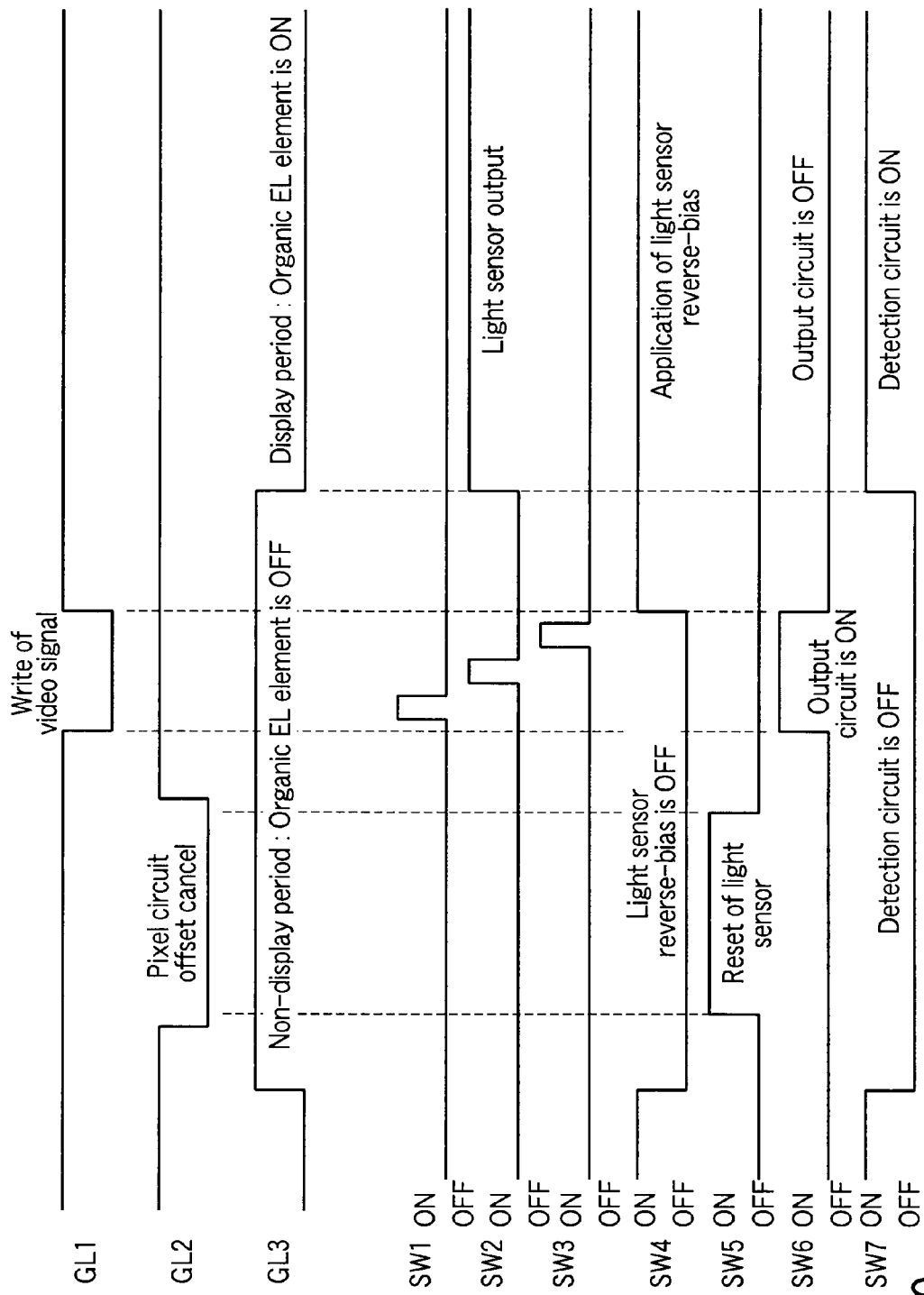
FIG. 10 is a timing chart for describing an example of a video signal write mode and a sensor mode in the embodiment.

FIG. 10 is a timing chart for describing an example of a video signal write mode and a sensor mode.

In the video signal write mode, at a timing when the video signal output side is selected, the switch SW6 is turned on and an ON signal is supplied to the first gate line GL1. Accordingly, the switch SWA in each of the pixel circuits 40 of the first to third pixels PX1 to PX3 is rendered conductive. While the switch SW6 is in the ON state, the switches SW1, SW2 and SW3 are successively turned on, and the video signal is output to the associated video signal lines SG1, SG2 and SG3. The video signal, which is output to the video signal line SG1, is written in the pixel circuit 40 of the first pixel PX1. Similarly, the video signal, which is output to the video signal line SG2, is written in the pixel circuit 40 of the second pixel PX2, and the video signal, which is output to the video signal line SG3, is written in the pixel circuit 40 of the third pixel PX3. During the time period of the video signal write mode, the switch SW7 is in the OFF state.

After the video signal has been written, the mode is switched to the sensor mode. Specifically, at this timing, the switch SW6 is turned off. Then, the switch SW7 is turned on. At the timing when the switch SW7 is turned on, an ON signal is supplied to the third gate line GL3, and the switches SWD and SWb, which are connected to the third gate line GL3, are rendered conductive. At this time, in each of the pixel circuits 40 of the first to third pixels PX1 to PX3, the amount of current, which is controlled by the switch SWB, is supplied from the power supply line P to the red organic EL element 60R, green organic EL element 60G and blue organic EL element 60B. Thereby, each organic EL element emits light with a predetermined luminance. On the other hand, in the driving circuit of light sensor 90, the switch SW4 is turned on to apply a reverse bias to the light sensor 80 via the video signal line SG3, and thereafter the switch SW2 is turned on and the light-reception signal, which is output from the light sensor 80, is supplied to the video signal line SG2 and output to the light-sensing signal circuit via the switch SW7. Thereby, contact on the display surface DSP, for example, is determined.

In the non-display period, the third gate line GL3 is turned off, the switch SW7 is turned off, and the switch SW4 is turned off, and thereby the reverse bias is turned off. In the non-display period, the pixel circuit 40 is offset-canceled via the second gate line GL2, and the light sensor 80 is reset via the switch SW5.

By the above-described structure, the control of the driving of the organic EL element 60 and the control of the driving of the light sensor 80 can be executed.

The present invention is not limited directly to the above-described embodiment. In practice, the structural elements can be modified and embodied without departing from the spirit of the invention. Various inventions can be made by properly combining the structural elements disclosed in the embodiment. For example, some structural elements may be omitted from all the structural elements disclosed in the embodiment. Furthermore, structural elements in different embodiments may properly be combined.

In the present embodiment, the light-shield layer SL is disposed on the fourth insulation film 114. The position of the light-shield layer SL is not limited to this example, if the light-shield layer SL is disposed between the light sensor 80 and the display surface DSP, or between the light sensor 80 and the sealing substrate 200. For example, the light-shield layer SL may be disposed above the partition wall 70, that is, on the sealing substrate 200 side, or may be disposed on the outer surface 200A or inner surface 200B of the sealing substrate 200. On the other hand, in order to reduce the influence of light which is incident on the light-sensing part 81A in an oblique direction, it is preferable to dispose the light-shield layer SL as close as possible to the light sensor 80.

In the present embodiment, the organic EL display device has been described as the organic EL device. However, the embodiment is applicable, for example, to an organic EL illumination device or an organic EL printer head.

What is claimed is:

1. An organic EL device comprising:
an array substrate including an insulating substrate and an organic EL element which is disposed above the insulating substrate;
a sealing substrate which is disposed on that side of the array substrate that faces the organic EL element, and is attached to the array substrate;
a light sensor which is provided in the array substrate, is disposed above the insulating substrate, and includes a light-sensing part which receives incident light via the sealing substrate; and
a light-shield layer which is disposed between the light sensor and the sealing substrate, and includes an opening portion which is formed right above the light-sensing part of the light sensor,
wherein the organic EL element is of a top-emission type that emits light from the sealing substrate side,
the organic EL element includes a first electrode which is disposed above the insulating substrate and including a reflective layer, an organic layer which is disposed above the first electrode, and a second electrode which is disposed above the organic layer, and
the light-shield layer is formed of a same material in a same layer as the reflective layer of the first electrode.

2. The organic EL device according to claim 1, wherein the sealing substrate has an outer surface on which a display surface, which displays an image formed by light emitted from the organic EL element, is formed.

3. The organic EL device according to claim 1, wherein the light sensor includes a semiconductor layer which is disposed above the insulating substrate, and an anode and a cathode which are put in contact with the semiconductor layer, and the semiconductor layer, which is exposed from the anode and the cathode, forms the light-sensing part.

4. The organic EL device according to claim 3, wherein the opening portion, which is formed in the light-shield layer, is formed to have a size equal to a size of the light-sensing part or a size smaller than the size of the light-sensing part.

5. The organic EL device according to claim 3, wherein the light-shield layer is formed right above the anode and the cathode of the light sensor and extends toward an outside of the anode and the cathode.

6. An organic EL device comprising:
an insulating substrate;
a first insulation film disposed above the insulating substrate;
a first semiconductor layer disposed on the first insulation film;
a second semiconductor layer which is disposed on the first insulation film and includes a light-sensing part;
a second insulation film which covers the first semiconductor layer and the second semiconductor layer and is disposed on the first insulation film;
a gate electrode which is disposed on the second insulation film right above the first semiconductor layer;
a third insulation film which covers the gate electrode and is disposed on the second insulation film;
a source electrode and a drain electrode which are disposed on the third insulation film and are put in contact with the first semiconductor layer;
an anode and a cathode which are disposed on the third insulation film, are put in contact with the second semiconductor layer, and expose the light-sensing part;
a fourth insulation film which covers the source electrode, the drain electrode, the anode and the cathode, and is disposed on the third insulation film;
a first electrode which includes a reflective layer disposed on the fourth insulation film, and is connected to the drain electrode;
a light-shield layer which is disposed on the fourth insulation film right above the anode and the cathode, is formed of the same material as the reflective layer, and includes an opening portion which is formed right above the light-sensing part;
an organic layer disposed on the first electrode; and
a second electrode disposed on the organic layer.

7. The organic EL device according to claim 6, further comprising a partition wall which is disposed along a peripheral edge of the first electrode and covers the light-shield layer.

8. The organic EL device according to claim 6, wherein the organic layer includes a phosphorescent material.

9. The organic EL device according to claim 6, further comprising a protection film which covers the second electrode and is formed of an inorganic compound.

10. The organic EL device according to claim 9, further comprising a sealing substrate disposed above the protection film.

11. The organic EL device according to claim 10, further comprising a resin layer disposed between the protection film and the sealing substrate.

* * * * *